United States Patent
Ludwig (10) Patent No.: US 8,125,367 B2
(45) Date of Patent: Feb. 28, 2012

(54) AM CHIRP LADAR READOUT CIRCUIT AND MODULE

(75) Inventor: David Ludwig, Irvine, CA (US)

(73) Assignee: Irvine Sensors Corp., Costa Mesa, CA (US)

( * ) Notice: Subject to any disclaimer, the term of this patent is extended or adjusted under 35 U.S.C. 154(b) by 56 days.

(21) Appl. No.: 12/804,267

(22) Filed: Jul. 15, 2010

(65) Prior Publication Data
US 2011/0032130 A1 Feb. 10, 2011

Related U.S. Application Data

(60) Provisional application No. 61/273,574, filed on Aug. 6, 2009.

(51) Int. Cl.
*H03M 1/12* (2006.01)
(52) U.S. Cl. ........................... 341/155; 341/122
(58) Field of Classification Search .................. 341/122, 341/155; 356/5.09, 5.01
See application file for complete search history.

(56) References Cited

U.S. PATENT DOCUMENTS 4,659,931 A 4/1987 Schmitz et al.
(Continued)

OTHER PUBLICATIONS

DIPL.-ING. Robert Lange, 3D Time-of-Flight Distance Measurement w/Custom Solid-State Image Sensors in CMOS/CCD-Technology, Jun. 28, 2000.
(Continued)

*Primary Examiner* — Jean B Jeanglaude
(74) *Attorney, Agent, or Firm* — W. Eric Boyd, Esq.

(57) ABSTRACT

A readout circuit which may be in the form of a readout integrated circuit or ROIC is disclosed for use in an AM chirp LADAR system having a photodetector coupled to a passive electronic filter. The filter output is coupled to a capacitive-coupled transimpedance amplifier with an output coupled to an analog storage register. The analog storage register output is coupled to a sample-and-hold circuit which in turn is coupled to an analog to digital converter circuit. In the stacked configuration, each IC operates independently and outputs its signals on a unique output line. The stacked ICs operate under the same set of control vectors as the individual ICs comprising the stack.

10 Claims, 6 Drawing Sheets

U.S. PATENT DOCUMENTS

| | | | |
|---|---|---|---|
| 5,214,274 A | 5/1993 | Yang | |
| 5,262,837 A | 11/1993 | Shyy | |
| 5,682,229 A | 10/1997 | Wangler | |
| 5,875,158 A | 2/1999 | Schell | |
| 5,953,110 A | 9/1999 | Burns | |
| 6,844,924 B2 * | 1/2005 | Ruff et al. | 356/5.09 |
| 7,002,628 B1 * | 2/2006 | Panicacci | 348/307 |
| 7,180,579 B1 | 2/2007 | Ludwig et al. | |
| 7,199,872 B2 | 4/2007 | Van Cranenbroeck | |
| 7,436,494 B1 | 10/2008 | Kennedy et al. | |
| 7,570,347 B2 * | 8/2009 | Ruff et al. | 356/5.01 |
| 2003/0076485 A1 * | 4/2003 | Ruff et al. | 356/5.09 |
| 2008/0246944 A1 * | 10/2008 | Redman et al. | 356/5.09 |
| 2009/0002680 A1 * | 1/2009 | Ruff et al. | 356/5.09 |

OTHER PUBLICATIONS

MESA Imaging, SR4000 Date Sheet, Rev. 3.0, Aug. 7, 2009.
MESA Imaging, SR4000 User Manual 1.4.
Barry L Stann, WM. C. Ruff, Zoltan G. Sztankay, Intensity-Modulated Diode Laser Radar Using Frequency-Modulation/Continuous-Wave Ranging Techniques, Optical EE, vol. 35, Nov. 1996.

* cited by examiner

AM CHIRP LADAR READOUT CIRCUIT AND MODULE

CROSS-REFERENCE TO RELATED APPLICATIONS

This application claims the benefit of U.S. Provisional Patent Application No. 61/273,574, filed on Aug. 6, 2009 entitled "Miniature LADAR Device" pursuant to 35 USC 119, which application is incorporated fully herein by reference.

STATEMENT REGARDING FEDERALLY SPONSORED RESEARCH AND DEVELOPMENT

N/A

DESCRIPTION

1. Field of the Invention

The invention relates generally to the field of electronic circuits. More specifically, the invention relates to a high signal-to-noise read out circuit and module for use in an imaging device such as an amplitude modulated chirp LADAR imaging system.

2. Background of the Invention

Existing photodetector sensor read out integrated circuits (or "ROICs") used in imaging circuitry are greatly constrained in functionality due to very small unit cell size. Typical unit cells used with visible CCDs and CMOS active pixel sensors ("CMOS APS") are approaching sizes less than four microns. Active LADAR sensor systems are currently designed with unit cells of 50 microns or less. Unit cell design philosophy is primarily dominated by area constraints. However, high density microelectronic integrated circuit ("IC") chip stacking technology provides the ROIC designer new freedom in unit cell design by offering in the range of up to one hundred times the unit cell design area provided under prior art, non-stacked design considerations.

Applicant discloses an amplitude modulated ("AM") LADAR receiver circuit and ROIC wherein the unit cell processing real estate for a preferred embodiment may be increased from about 50×50 microns to about 50×5000 microns using the above referenced stacked IC chip process.

Figure 1A:
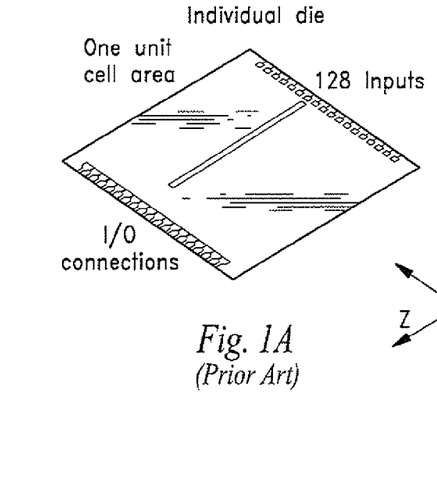
FIGS. 1A, 1B and 1C show an integrated circuit chip, a stack of integrated circuit chips and a stack of integrated circuit chips with a photodetector to be bump bonded on the surface of the stack of chips.
Figure 1B:
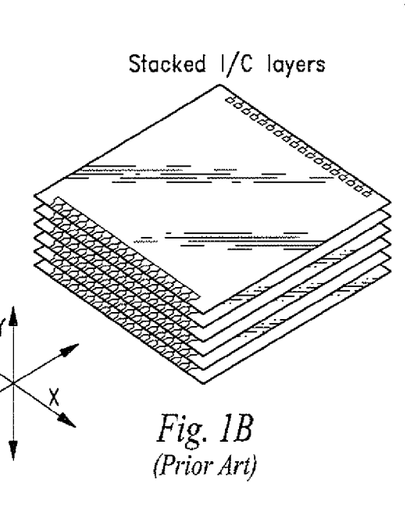
Figure 1C:
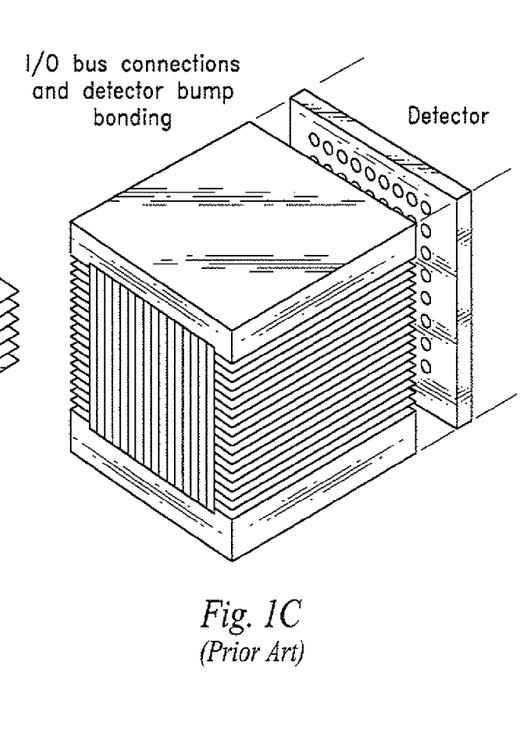

An exemplar imaging module architecture incorporating the stacked IC chip technology referred to above is shown in FIGS. 1A, 1B and 1C and is disclosed in U.S. Pat. No. 7,436,494 entitled "Three-Dimensional LADAR Module With Alignment Reference Insert Circuitry" to Kennedy et al. and issued on Oct. 14, 2008.

FIG. 1A shows an IC layer having a unit cell of the invention fabricated thereon and having I/O connections and detector inputs that define edge electrical connection points when the layers are stacked. FIG. 1B shows a plurality of layers whereby the respective I/O connections and detector inputs in vertical alignment. FIG. 1C shows a bonded stack of IC layers and a photodetector element to be electrically connected detectors inputs using the edge connection points of the layers in the stack: The I/O connections may be interconnected or connected to external control circuitry using metalized "T-connect" structures defined by photolithography and plating methods.

In such a stacked architecture, each IC in the stack of ICs contains the photodetector output signal processing unit cells for one row in the sensor's detector array of pixels. The number of pixel columns in the sensor's detector array determine the desired number of ICs in the stack.

The photodetector array is conventionally bump-bonded (such as indium bump-bonding) after the IC stacking process is completed. Individual IC layers in the stack are designed with at least the number of unit cell channels necessary to readout a single row of pixels in the detector array. The unit cell spacing is based upon the detector pixel pitch in the X-axis but can be arbitrarily long in the Z-axis. The final size of the completed photodetector imaging module of the invention is based on several stacking processing factors, but can be quite small.

SUMMARY OF THE INVENTION

A readout circuit such as may be defined on an integrated circuit is disclosed for use in an AM chirp LADAR system. The circuit comprises a photodetector such as a metal-semiconductor-metal detector coupled to a passive electronic filter. The filter output coupled to a capacitive-coupled transimpedance amplifier with an output coupled to an analog storage register. The analog storage register output is coupled to a sample-and-hold circuit which in turn is coupled to an analog to digital converter circuit. The output of the sample and hold circuit is digitized by an analog-to-digital converter circuit for further processing. The circuit may be used as a cell for the readout of an individual pixel on a photodetector or a plurality of cells used in a stack of integrated circuit chips for the read out of a plurality of pixels in a photodetector array.

Each IC layer in the stacked photodetector imaging module of the invention is identical to its mates and has a unit cell comprised of a capacitance coupled transimpedance amplifier and analog storage register for receiving the output of a pixel in a detector array. The IC layers share one or more common busses using "T-connect" structures on the module surface opposite the detector array. The common bus carries common signals such as power, clocks, and control signals. In the stacked configuration, each IC operates independently and outputs its signals on a unique output line. The stacked ICs operate under the same set of control vectors as the individual ICs comprising the stack. No communication is required between layers, simplifying the design and control process.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE INVENTION

As discussed more fully below, the circuit of the invention generally comprises a filter circuit having a photodetector coupled to a filter having an input and an output, the filter output coupled to a capacitive-coupled transimpedance amplifier, the capacitive-coupled transimpedance amplifier coupled to an analog storage register, the analog storage register coupled to a sample-and-hold circuit, and the sample and hold circuit coupled to an analog-to-digital converter circuit. A plurality of the above circuits may be defined on a plurality of integrated circuit chips that are stacked and interconnected to form a detector read out module for use with a planar photodetector array.

Figure 2:
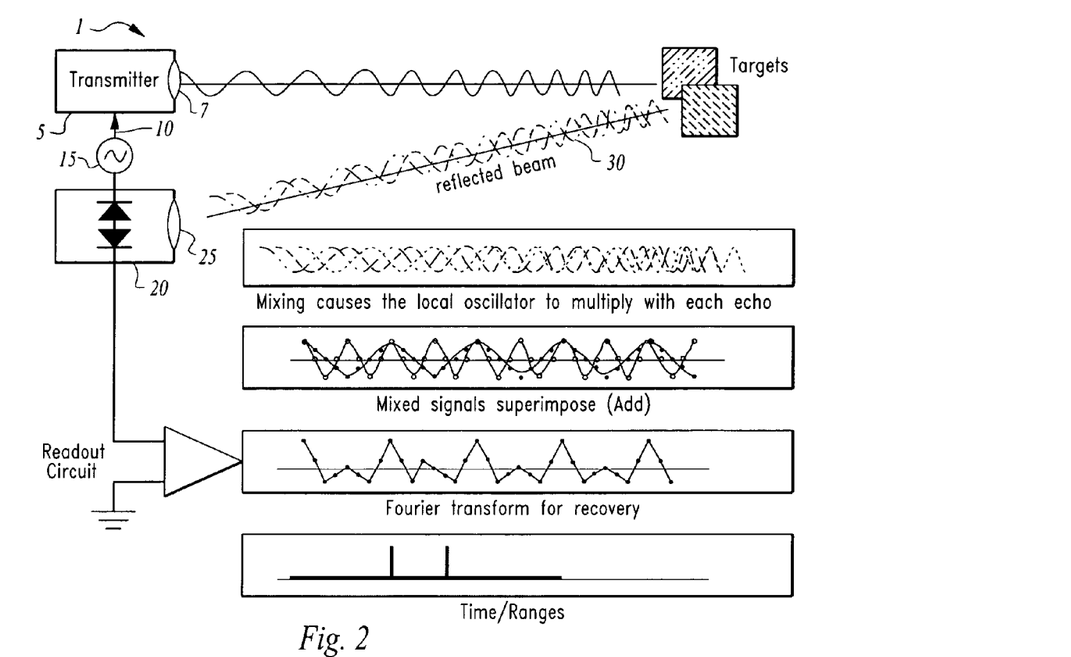
FIG. 2 is a block diagram of the LADAR device of the invention.

Turning to the FIG. 2 wherein like numerals define like elements among the several views, a block diagram of a preferred embodiment of the AM LADAR chirp LADAR imaging device 1 and method of the invention is illustrated.

Transmitter 5 comprises a laser imaging means such as a continuous wave laser with suitable optics 7. The laser beam output is modulated by a sine wave 10 using modulation means such as local oscillator 15. The amplitude of the continuous wave (CW) laser output is modulated in a chirp pattern, e.g., the frequency of the sine wave amplitude is varied from about 300 MHz to about 1.3 GHz during an image frame.

The change (i.e., delta) in frequency ($\Delta F$) determines the basic range resolution of the system ($\Delta R$) by the equation:

$$\Delta R = c/(2\Delta F)$$

This same local oscillator frequency is used to modulate the bias on back-to-back Schottky diodes in the form of metal-semiconductor-metal or MSM photodetectors 20 with suitable receiver optics 25. The return echo chirped signals 30 are mixed on the detectors with the local oscillator bias.

Depending on the material that the MSM detector is made from, a suitable laser is selected. The use of GaAs MSMs will dictate lasers around 800 to 1000 nm. InGaAs MSMs detectors would dictate lasers operating at about 1.3 um and beyond.

A laser diode may be used in the invention as an imaging means but must be CW, i.e., continuous wave. The CW laser is then modulated at the chirp frequencies. One watt is a typical power level. The lasers can be VCSEL, vertical cavity surface emitting laser, or edge emitting laser diodes.

A signal mixing operation is performed as a multiplication of the local oscillator signal and the return chirp echoes. The echoes that return are slightly out of phase with each other and are used to calculate different ranges of the surfaces from which they are reflected.

The features and specifications of a preferred embodiment of the ROIC of the invention are given in Table 1.

TABLE 1

| FEATURE | Specification | Units |
| --- | --- | --- |
| Detector Interface | Capacitive Coupled Transimpedance Amplifier | |
| Amplifier Transimpedance Control | 3-bit DAC controlled gain (capacitor selection) | |
| On ROIC Sample Storage | 4096 | Bins/unit cell |

TABLE 1-continued

| FEATURE | Specification | Units |
| --- | --- | --- |
| Maximum IF Frequency | 1E6 | Hz |
| Maximum Sample Frequency | 4E6 | Hz |
| Amplitude Storage Resolution | 8 | bits |
| Output Data Rate | 40E6 | Hz |
| Number of Channels per Layer | 32 | |

Figure 3:
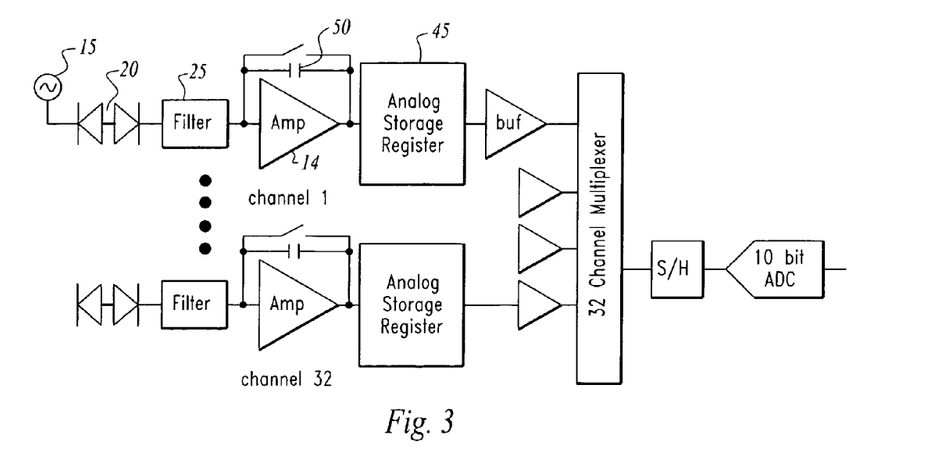
FIG. 3 illustrates a block diagram of the read out circuit of the invention.

Turning to the block diagram of the AM chirp circuit of FIG. 3, which may be in the form of an integrated circuit chip, the read out circuit has a suitable passive electronic filter 35 prior to amplification of the detector output signals. Filter 35 serves to block the RF local oscillator frequencies. A capacitive-coupled transimpedance amplifier ("CTIA") 40 is coupled to filter 35 and receives the output thereof then converts the output of the detector from an intermediate frequency ("IF") current into a voltage output.

Figure 4:
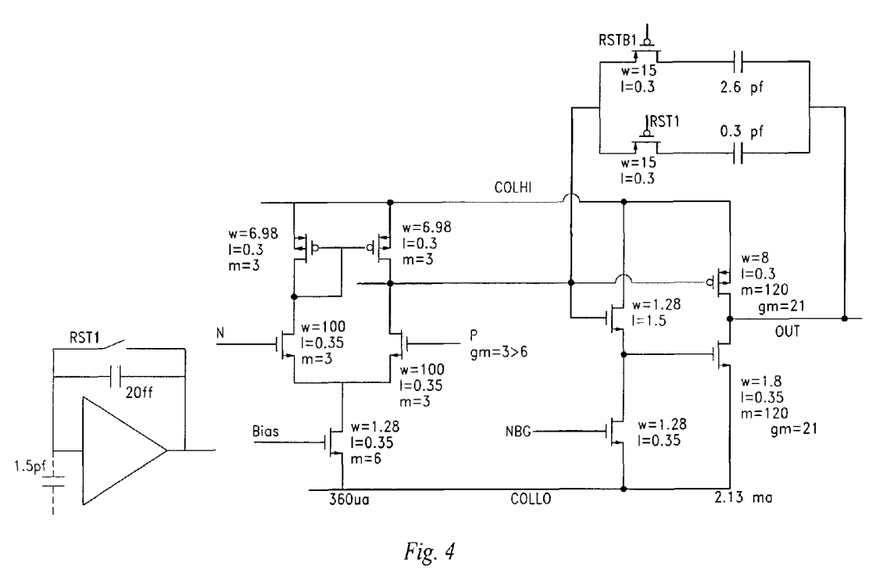
FIG. 4 shows a schematic of a preferred embodiment of a capacitance-coupled transimpedance amplifier of the invention.

A preferred embodiment of a capacitive-coupled transimpedance amplifier is shown in FIG. 4.

The capacitive-coupled transimpedance amplifier 35 permits integration of the detector output current prior to sampling the capacitive-coupled transimpedance amplifier output voltage into the analog storage register 45. The size of the feedback capacitor 50 is user-selectable so that operation with various user-selected chirp periods and/or laser output powers can be accommodated.

The capacitive-coupled transimpedance amplifier output 40 is sampled into analog storage register 45 and records the capacitive-coupled transimpedance amplifier's output amplitude over 4096 time increments during a frame in the preferred embodiment.

The detector's maximum IF frequency is oversampled four times by the input to the analog storage register 45. During readout, the data stored in the analog storage register is converted to an 8-bit digital format.

Figure 5:
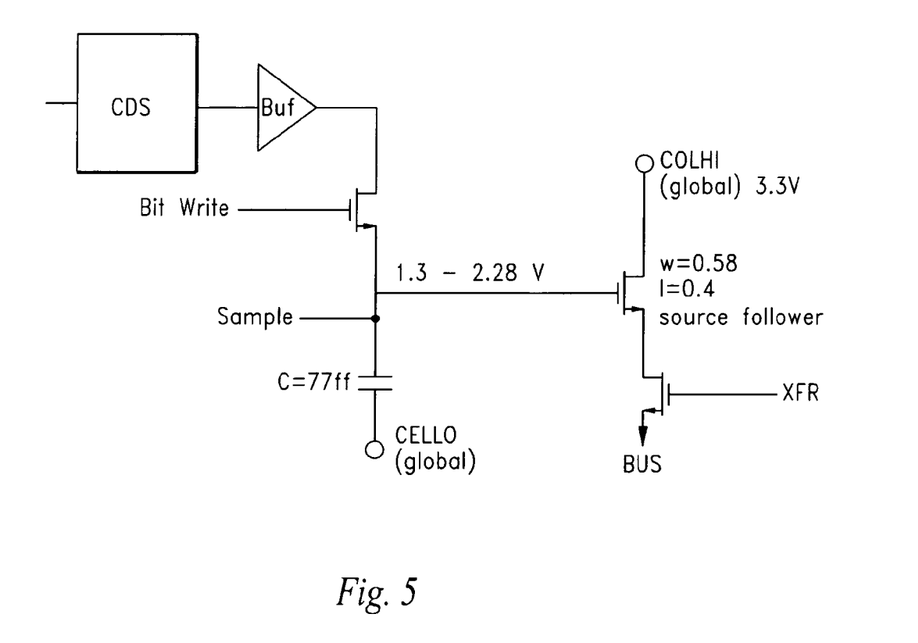
FIG. 5 shows a schematic of a preferred embodiment of an analog storage register circuit of the invention.

As seen in the preferred memory cell circuit shown in FIG. 5, the analog storage register may comprise a 77 femtofarad capacitor that can be charged to an equivalent of 8 bits. A preferred analog storage register 45 may be configured as a plurality of 77 fF capacitors in a 512×8 arrangement per pixel. Any value could be used for capacitance and number of pixels. The capacitors are all reset at the beginning of the frame. The CTIA dumps its charge from its feedback capacitor into the storage caps.

The storage capacitors are turned on in sequence to build a 4096 (512×8) time sequence of the output of the CTIA. The memory switch is turned on to transfer charge, then open circuit to hold the charge until read out time. At the output time a switch is turned on to dump the 77 fF capacitor's charge into the differential column amp. This buffers the 77 fF capacitor's charge and provides the interface to the ADC. The 77 fF capacitors are read out one after another until all 4096 are read out. Then they are reset for the next chirp frame.

This data is then read out of the circuit at a 40 MHz rate or, if in a stacked IC configuration, from each IC in the stack, preferably by use of a multiplexing circuit.

The readout circuit takes advantage of mixing of the incoming laser echo with a local oscillator output driving the photodetector bias on back-to-back MSM detector diodes. A wide range of photovoltaic (PV) detector types can be used in the invention. The preferred embodiment uses GaAs MSM (metal-semiconductor-metal) Schottky detector diodes primarily due to their manufacturing simplicity. InGaAs MSM detectors are also available for use at eye safe wavelengths.

If the low-to-high delta modulation frequency of the chirp waveform is 1 GHz, (e.g., 300 MHz to 1.3 GHz), the range resolution possible in this embodiment is about 0.15 meters. The longer the analog storage register provided, the longer the unambiguous range depth is extended. For instance, using 0.25 micron design rules, an analog storage register with a length of 4096 bins is attainable.

The analog storage register of the invention is based on the design used for a CMOS Active Pixel Sensor arrays. In the CMOS APS, a photodiode is located in each unit cell to collect the image energy. In a CMOS APS, the detector current is integrated on the diode's parasitic capacitance. After the integration period, the charge on the diode is readout through a column read line by scanning one pixel row at a time.

The AM chirp readout circuit operates in similar fashion except that the photodiode is replaced by a physical capacitor and the detector signal is fed into the capacitor from the output of the capacitive-coupled transimpedance amplifier, rather than an imbedded silicon photodiode.

In operation, after a reset sequence in which the storage array capacitors are discharged, the capacitive-coupled transimpedance amplifier output voltage is sampled and held into the analog storage register capacitors in sequence. A one-bit shift register activates a read FET in each of 4096 storage bins during the chirp period. Since the chirp period is variable, the rate at which the bin write/reset register of the circuit operates is user-definable.

Figure 6:
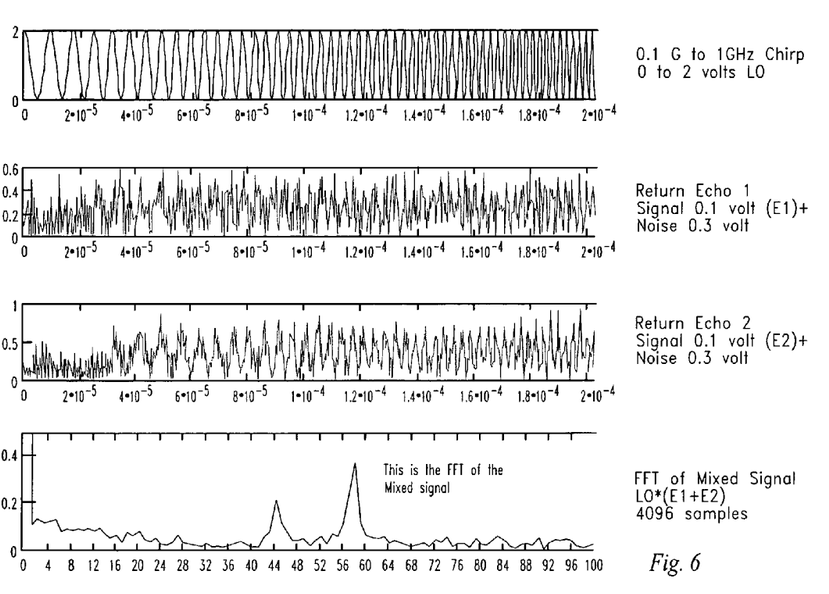
FIG. 6 illustrates various wave forms showing the varying chirp modulation frequency from a local oscillator, return echo 1, return echo 2 and the resultant FFT of the two return echoes and the local oscillator frequency.

An exemplar IC signal read out is illustrated in the first waveform in FIG. 6. The mixed signal is reduced to an intermediate frequency (IF). If more than one echo is returned, the one or more IF signals of each echo are added. This is best shown as the second and third waveform in FIG. 6. A Fourier transform such as an FFT is performed to change the mixed and added signals from the time domain to the frequency domain. As seen in the fourth waveform of FIG. 6, the sum of the two IF signals show up as frequencies in the FFT domain which is used to calculate the range of the surface of an object from which the echoes are returned.

An additional benefit of using the AM chirp algorithm is that using an FFT process allows significant improvement in the signal-to-noise ratio of the system. In other words, the more samples acquired, the greater the power of the FFT is in recovering the SNR.

The preferred maximum frequency of operation of this embodiment is 4 MHz. This permits the minimum chirp period of 1 msec to fill all 4096 bins. The minimum frequency of operation is 62.5 KHz, a division of write/reset bin clock by 64. This allows chirp periods of up to 62 msec to fill the storage register bins.

The storage bin readout method of the invention takes advantage the CMOS APS principle. After the storage registers are filled, the read sequence begins. A one-bit bin read shift register strobes the read FETs in each of the row storage bins. The charge on the capacitor is dumped in sequence into a column buffer amplifier and column 8-bit analog-to-digital ("ADC") converter. The ADC outputs serial 8-bit data to the output line. The read rate remains a constant 40 MHz regardless of the write bin rate.

This data rate permits recovery of the information off of the ROIC with conventional digital data acquisition plug-in boards. The data is supplied with a pixel clock, line clock and frame clock information from the ROIC for proper data capture synchronization. Other signals returned by the IC may include a flag when the complete storage register is successfully reset and when the storage register is successfully filled with data.

The storage registers are reset using the same one-bit write/reset shift register that is used to activate the write sequence. The register column input terminal is tied to ground instead of the capacitive-coupled transimpedance amplifier output during the reset cycle. The reset cycle is run at the full 4 MHz rate, independent of the chirp period. This increases the frame rate for longer chirp periods.

Figure 7A:
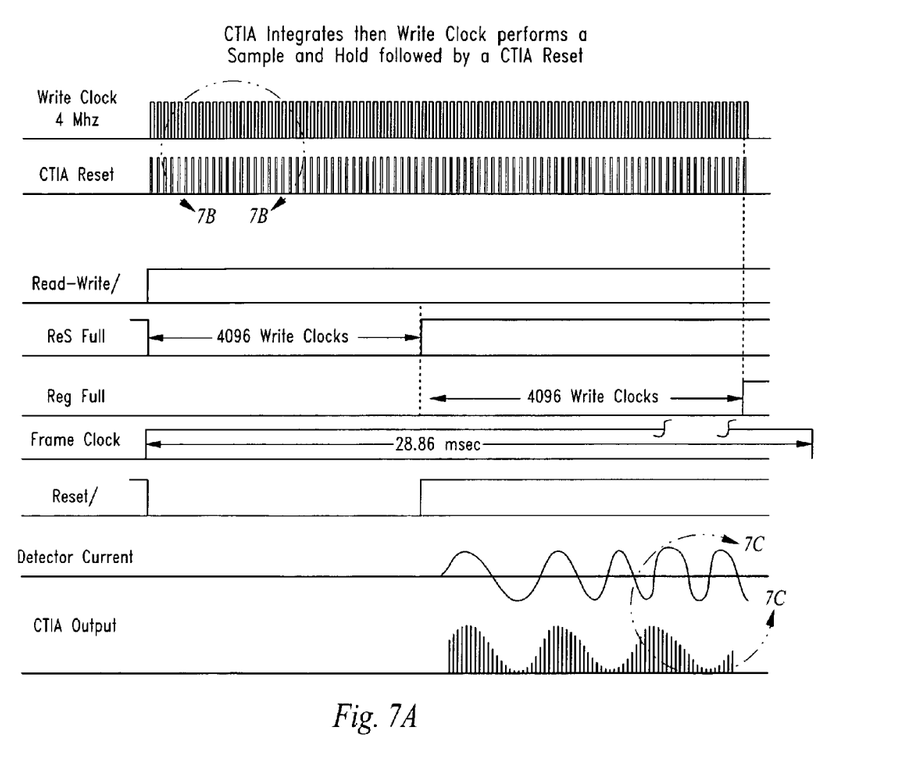
FIG. 7 is a write timing detail of the read out circuit of the invention showing the "integrate and dump" feature of the capacitive coupled transimpedance amplifier.
Figure 7B:
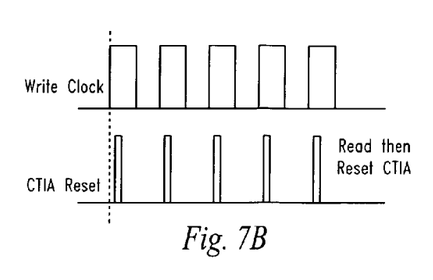
Figure 7C:
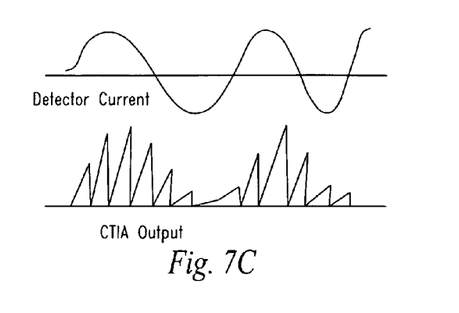

Following the reset cycle, the capacitive-coupled transimpedance amplifier output is sample-held and reset for each storage register in the column. The details of the write operation at the 4 MHz rate are shown in FIGS. 7A, 7B and 7C. Voltage data is transferred from the capacitive-coupled transimpedance amplifier output to the storage register during the rising edge of the write clock. Shorting the feedback capacitor then resets the capacitive-coupled transimpedance amplifier and makes it ready for the next integration and transfer to the next storage register bin.

Filling the storage registers is accomplished in two passes. During the first pass, the input to the storage register capacitor is tied to ground. After 4096 clocks of the Bin Write/Reset clock, each storage element in a column is reset. At the conclusion of the reset cycle, a ReS (reset) flag is issued. The reset flag goes low at the end of a read cycle. The second pass is accomplished with the storage register column line tied to the capacitive-coupled transimpedance amplifier. After 4096 additional registers clocks, the bins are filled. The Write cycle is completed when the Reg Full flag goes high.

The capacitive-coupled transimpedance amplifier sees the beat frequency of the local oscillator and the received laser echo. An object at a fixed range generates a constant beat frequency. The minimum beat frequency is about one thousand times less than the maximum IF (4096 bins/4 times oversampling). The detector signal is then integrated within the capacitive-coupled transimpedance amplifier during the sample period.

With a one msec chirp, the capacitive-coupled transimpedance amplifier integration period is about 0.25 microseconds. When the system operates in this mode, the frame time is dominated by the time required to read the data from the storage registers.

In this embodiment, by adjusting the sample rate of the capacitive-coupled transimpedance amplifier and storage registers with the chirp period, the unambiguous range depth can be held to about 153 meters. To obtain longer unambiguous ranges, a hold-off in ROIC timing is performed which allows the data capture to occur a fixed period after the initiation of the chirp. The maximum range of a LADAR system incorporating the invention is affected by the laser energy, optics aperture, integration period and the ROIC noise level.

An exemplar capacitive-coupled transimpedance amplifier schematic for use in the invention is shown in FIG. 8 in the form of a classic differential input amplifier.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

I claim:

1. An electronic circuit comprising:
a filter circuit having a filter input and a filter output,
the filter output coupled to a capacitive-coupled transimpedance amplifier,
the capacitive-coupled transimpedance amplifier coupled to an analog storage register,
the analog storage register coupled to a sample-and-hold circuit,
the sample and hold circuit coupled to an analog-to-digital converter circuit.

2. The circuit of claim 1 wherein the filter input is coupled to a detector circuit.

3. The circuit of claim 2 wherein the detector circuit is a metal-semiconductor-metal detector circuit having a detector bias.

4. The circuit of claim 3 wherein the detector bias is modulated by a predetermined frequency.

5. A device comprised of a plurality of electronic circuits, wherein at least two of the electronic circuits comprise:
a filter circuit having a filter input and a filter output,
the filter input coupled to a capacitive-coupled transimpedance amplifier,
the output of the capacitive-coupled transimpedance amplifier coupled to an analog storage register,
wherein at least two of outputs of the plurality of analog storage registers are coupled to a multiplexer circuit,
the output of the multiplexer circuit is coupled to a sample-and-hold circuit and the sample and hold circuit is coupled to an analog-to-digital circuit.

6. The device of claim 5 wherein the filter input is coupled to a detector circuit.

7. The device of claim 6 wherein the detector circuit is a metal-semiconductor-metal detector circuit.

8. The device of claim 7 wherein the detector bias is modulated by a predetermined frequency.

9. The device of claim 5 wherein at least two of the electronic circuits comprise two integrated circuit chips.

10. The device of claim 9 wherein the at least two integrated circuit chips are bonded and stacked to define a microelectronic module.

* * * * *